United States Patent [19]

McIlwraith

[11] Patent Number: 5,147,121
[45] Date of Patent: Sep. 15, 1992

[54] GASKET FOR PROVIDING EMI/RFI SHIELDING

[75] Inventor: George McIlwraith, Stone Mountain, Ga.

[73] Assignee: Gichner Systems Group, Inc., Dallastown, Pa.

[21] Appl. No.: 662,296

[22] Filed: Feb. 28, 1991

Related U.S. Application Data

[63] Continuation-in-part of Ser. No. 434,323, Nov. 13, 1989, Pat. No. 5,020,806, which is a continuation-in-part of Ser. No. 612,586, Nov. 9, 1990, abandoned.

[51] Int. Cl.$^5$ ............................................. A47B 88/00
[52] U.S. Cl. .................................. 312/296; 312/265.4
[58] Field of Search .......... 174/35 GC, 35 R, 35 MS; 361/424; 312/296, 265.1–265.4

[56] References Cited

U.S. PATENT DOCUMENTS

| | | |
|---|---|---|
| 3,026,367 | 3/1962 | Hartwell . |
| 3,583,930 | 8/1971 | Ehrreich et al. . |
| 3,812,316 | 5/1974 | Milburn . |
| 4,391,478 | 7/1983 | Grunert ............................. 312/296 |
| 4,572,921 | 2/1986 | May et al. ....................... 174/35 GC |
| 4,652,695 | 3/1987 | Busby . |
| 4,659,869 | 4/1987 | Busby . |
| 4,705,916 | 11/1987 | Wadhere et al. . |
| 4,720,606 | 1/1988 | Senn . |
| 4,864,070 | 9/1989 | Stickney . |

OTHER PUBLICATIONS

Schlegal EMI Shielding Gaskets Schlegal Corporation Undated.
Co–extruded Conductive Elastomer Strips undated.
Optima Vertical Cabinets EMI/RFI Shielded Features (p. 4) Gichner Optima Enclosures undated.
Optima R Series Vertical Cabinets EMI/RFI Shielded Features (p. 4) Gichner Optima Enclosures Undated.

*Primary Examiner*—Joseph Falk
*Attorney, Agent, or Firm*—Jones, Askew & Lunsford

[57] ABSTRACT

An improved device for providing EMI/RFI shielding for a joint is disclosed comprising a compressible, resilient sealing element and a conductive shielding element bonded to the sealing element and positioned such that the shielding element provides a direct electrical contact across the joint. The disclosed invention further provides a cabinet which effectively utilizes such a device. The disclosed invention also includes an improved cabinet construction which minimizes the paths by which moisture and debris may enter the cabinet interior, while providing a cabinet which is transportable without violating the integrity of the cabinet structure.

25 Claims, 6 Drawing Sheets

GASKET FOR PROVIDING EMI/RFI SHIELDING

CROSS REFERENCE TO RELATED APPLICATION

This is a continuation-in-part application of U.S. patent application Ser. No. 434,323 filed Nov. 13, 1989 now U.S. Pat. No. 5,020,806, which is also a continuation-in-part application of U.S. patent application Ser. No. 612,586 filed Nov. 9, 1990 now abandoned.

TECHNICAL FIELD

The present invention relates generally to gaskets, and more particularly to a gasket, for use with cabinets for housing electronic components and the like, which provides improved EMI/RFI shielding.

BACKGROUND OF THE INVENTION

In operation, computers, radios, transmitters and other electronic systems generate electrical signals in the form of radio frequency waves or electromagnetic radiation or both. If not properly shielded, these signals can interfere with the operation of unrelated equipment. Radio frequency interference ("RFI") is interference from sources of energy outside a system. Electromagnetic interference ("EMI") is interference generated within the system. To prevent EMI/RFI interference, governmental regulations and industry standards require that the sources of radio frequency and electromagnetic radiation within a system be shielded.

At the same time, sensitive electronic components must also be protected from more tangible forms of disruption. Other sources of disruption to the operation of electronics systems are moisture and foreign particles, such as dust. The presence of either of these environmental hazards can corrode or otherwise debilitate electrical contacts.

One method of protecting such systems from EMI/RFI interferences and exposure to moisture and dust is to place the equipment in a shielded cabinet. To provide adequate protection, the cabinet is preferably designed to eliminate grooves, crevices, and other openings which allow passage of RF waves and which accumulate and channel moisture and debris into the interior of the cabinet. The top of a cabinet is a notorious site for the accumulation of moisture and debris which subsequently tend to find their way into the cabinet. Conventional cabinets generally utilize a top construction having a top panel secured between the frame members of the cabinet. This provides a uniform flat surface across the top of the cabinet. Unfortunately, this juncture between the top panel and the frame members also provides a channel that is difficult to seal and does not inherently inhibit the passage of RF waves, moisture or debris. An example of such a cabinet construction is found in U.S. Pat. No. 4,768,845.

Another problem inherent in the design of cabinets concerns junctures or joints between components which form the cabinet. Such joints may be found between the cabinet frame and a door, or between the frame and panels connected to the frame. Solid metal cabinet components provide EMI/RFI shielding and protect against the intrusion of moisture and debris. However, each juncture between these components provides openings through which RF waves, moisture and debris may pass.

Several attempts have been made to provide a gasket for placement within these junctures to provide EMI/RFI shielding and to seal against the intrusion of moisture and debris. For example, U.S. Pat. No. 4,652,695 discloses a clip-on shielding strip designed to provide EMI/RFI shielding and which may be placed in the junctures between cabinet components. The device disclosed in the '695 patent utilizes a conductive mesh positioned around a resilient core. The core and mesh are secured to a metal clip with a clamping flange which clips to the mesh. The metal clip conductively contacts the cabinet frame and the conductive mesh conductively contacts to a side or door panel. This design has several disadvantages. The metal clip prevents this gasket from being fastened to curved surfaces and corners. Another disadvantage results from the juncture between the mesh and the clip, which juncture increases the resistance and thus adversely impacts the conductivity between the mesh and the metal clip. Additionally, this gasket provides a metal-to-metal interface which does not provide an effective seal against the passage of moisture and debris. Further, the metallic mesh is susceptible to a further reduction of conductivity by the accumulation of moisture and dirt on the mesh.

Another attempt to solve these problems is disclosed in U.S. Pat. No. 4,659,869. The '869 patent teaches a gasket having a conductive tubular element formed of an extruded, resilient elastomer conductively bonded to a U-shaped metal clip. This design attempts to provide EMI/RFI shielding and to seal against water and debris. However, since the same material is used for both the shielding and sealing functions, both are compromised. The elastomer does not provide as effective a barrier to moisture or debris as does a conventional rubber gasket and is more expensive. Furthermore, conductivity may be decreased by the accumulation of moisture and debris on the surface of the elastomer and by the resistant interface between the elastomer and metal clip. Additionally, the metal clip is not well suited for use on curved surfaces and corners.

Still another example, U.S. Pat. No. 4,864,070 discloses an electromagnetic shielding and environmental sealing device having an elastomer strip attached to a metal strip. The elastomer strip includes a tubular portion, a strip extending therefrom, and an extension portion extending back toward the tubular portion from the end of the strip. The metal strip defines fingers which fold over the extension portion of the elastomer strip. This device desires improvement because it requires the use of fasteners or adhesives for mounting, is expensive to produce, does not maintain a smooth, even appearance after repeated openings and closings of the door being sealed, and is not of a durability to withstand heavy use.

Therefore, despite the various efforts found in the prior art, there remains a need for an improved gasket which can effectively shield against EMI/RFI, provide an effective seal against moisture and debris, and maintain an attractive appearance even after being repeatedly compressed and released.

SUMMARY OF THE INVENTION

The present invention overcomes the above-discussed disadvantages in the prior art by providing an aesthetically pleasing device which provides improved EMI/RFI shielding, seals against the intrusion of moisture and debris, protects the shielding mechanism from degradation, and is conformable to curved surfaces and corners. The present invention also provides a cabinet which effectively utilizes such a device.

Generally described, the present invention provides a sealing device, comprising an elongate compressible, resilient head; a pair of legs extending downwardly from the head; and a conductor disposed between the legs and extending upwardly adjacent the outer surface of one of the legs and a portion of the head. The conductor comprises a plurality of individually movable fingers each extending from between the legs to the outer surface of the head, and means for interconnecting the fingers.

More particularly, the present invention provides in a preferred embodiment a sealing device, comprising an elongate compressible, resilient head having an ear formed thereon; a pair of legs extending downwardly from the head and having mutually facing inner surfaces; and a conductor disposed between the mutually facing surfaces and extending upwardly adjacent the outer surface of one of the legs and a portion of the head. The conductor comprises a first strip of conductive material spaced apart from a second strip of conductive material, the first strip being positioned adjacent the head and the ear and defining an inwardly curled lip for contacting the head, the second strip being positioned between the mutually facing surfaces and extending generally parallel to the facing surfaces and defining a second lip positioned intermediate the facing surfaces; and a plurality of spaced apart fingers, each extending from the first strip to the second strip and being shaped to bow outwardly from the outer surface of one of the legs.

Another aspect of the present invention provides an EMI/RFI shielded cabinet, comprising at least one frame member defining an elongate flange; at least one panel capable of being positioned adjacent to the flange, the flange and the panel defining an elongate joint therebetween; and a shielding device. The shielding device comprises an elongate compressible, resilient head; a pair of legs extending downwardly from the head; and a conductor disposed between the legs and extending upwardly adjacent the outer surface of one of the legs and a portion of the head. The conductor comprises a plurality of individually movable fingers each extending from between the legs to the outer surface of the head and means for interconnecting the fingers.

Still another aspect of the present invention provides an EMI/RFI shielded cabinet, comprising a first frame member defining a first elongate flange; a second frame member defining a second elongate flange, the second flange being positioned perpendicular to the first flange and having an end extending within a short space of an end of the first flange at a corner of the cabinet; a first shielding device positioned on the first flange and extending to the end of the first flange; a second shielding device positioned on the second flange and extending to the end of the second flange and abutting a side of the first shielding device.

Thus, it is an object of the present invention to provide an improved EMI/RFI shielding device.

It is another object of the present invention to provide an aesthetically pleasing EMI/RFI shielding device which seals against the intrusion of moisture and debris.

It is a further object of the present invention to provide an EMI/RFI shielding device which protects the shielding mechanism from degradation and exposure to moisture and debris.

Still another object of the present invention to provide an EMI/RFI shielding device that is suitable for use with curved surfaces and corners.

Yet another object of the present invention is to provide an improved EMI/RFI shielding cabinet.

Other objects, features, and advantages of the present invention will become apparent upon reading the following specification, when taken in conjunction with the drawings and the appended claims.

DETAILED DESCRIPTION OF THE DISCLOSED EMBODIMENT

Figure 1:
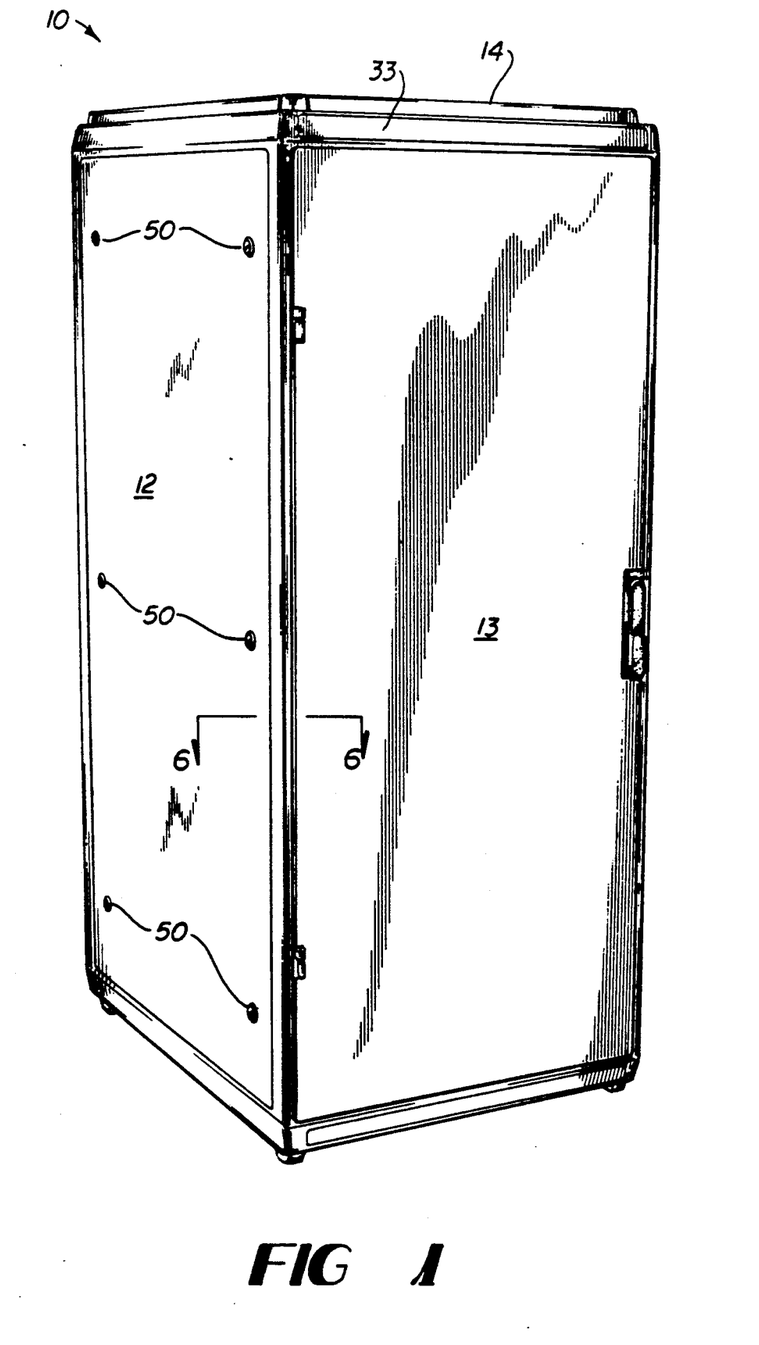
FIG. 1 is a perspective view of an EMI/RFI shielded cabinet.
Figure 2:
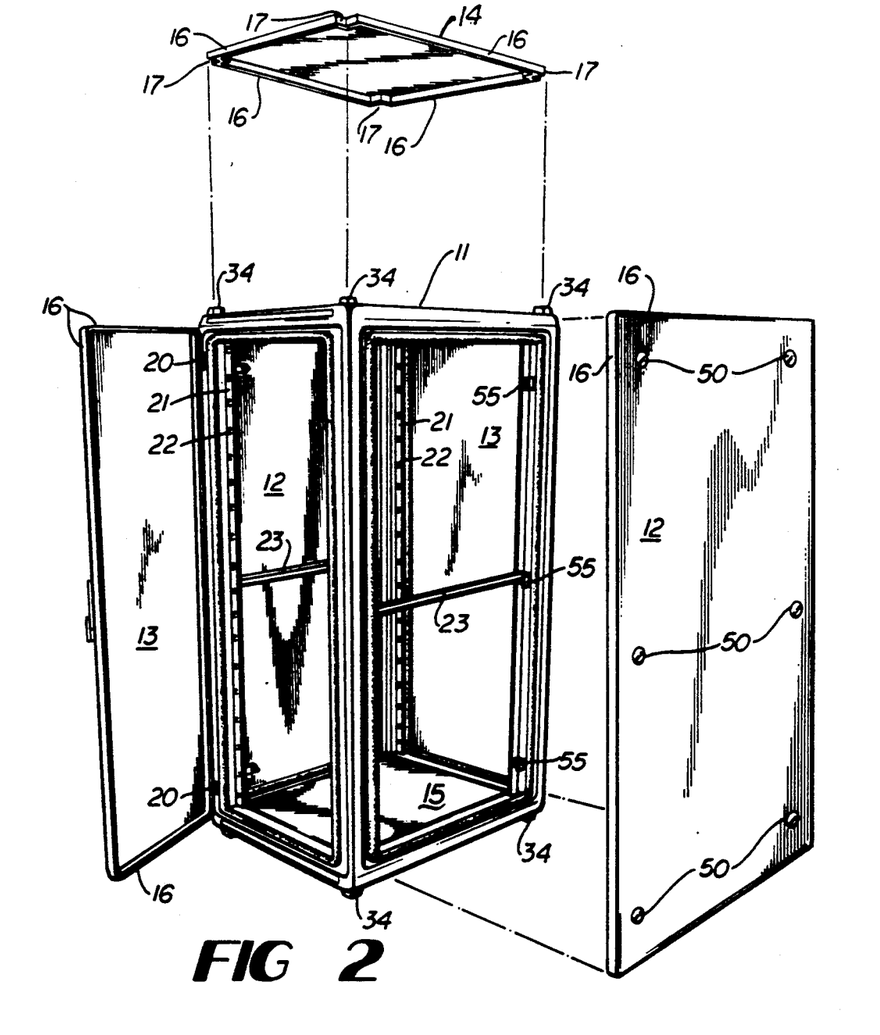
FIG. 2 is an exploded view of an EMI/RFI shielded cabinet, shown with the right panel and and top exploded and the door open.

Referring now in more detail to the drawings, in which like numerals indicate like parts throughout the several views, FIGS. 1 and 2 show an EMI/RFI shielding cabinet 10 on which the gasket of the present invention is preferably mounted. The cabinet 10 has a frame 11, side panels 12, door panels 13, a top panel 14, and a bottom panel 15. Each of the panels 12-15 are rectangular in shape and have a lip 16 formed on their edges. The top panel 14 has a rectangular cutout 17 at each corner. The side panels 12 and top panel 14 are mounted to the frame 11 as will be described later. Doors 13 are mounted to the frame 11 with hinges 20. The bottom panel 15 is bolted directly to the frame 11. A joint is defined at the intersection of each of the panels 12-15 and the frame 11. Brackets 21, having holes 22, and supports 23 are mounted to the frame 11 and enable trays or drawers to be installed in the cabinet.

Figure 3:
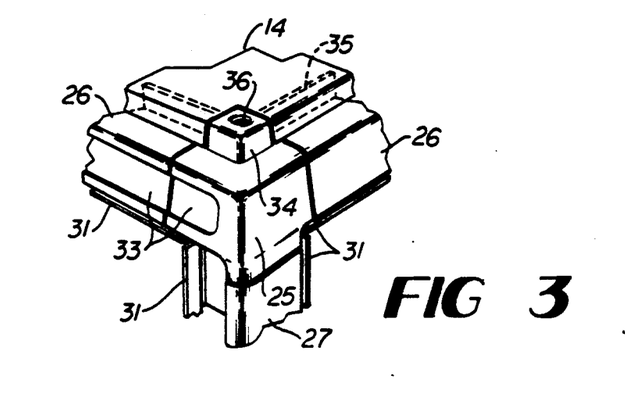
FIG. 3 is a close up view of the corner construction of an EMI/RFI shielded cabinet, showing the relationship between the corner and the top of the cabinet.
Figure 4:
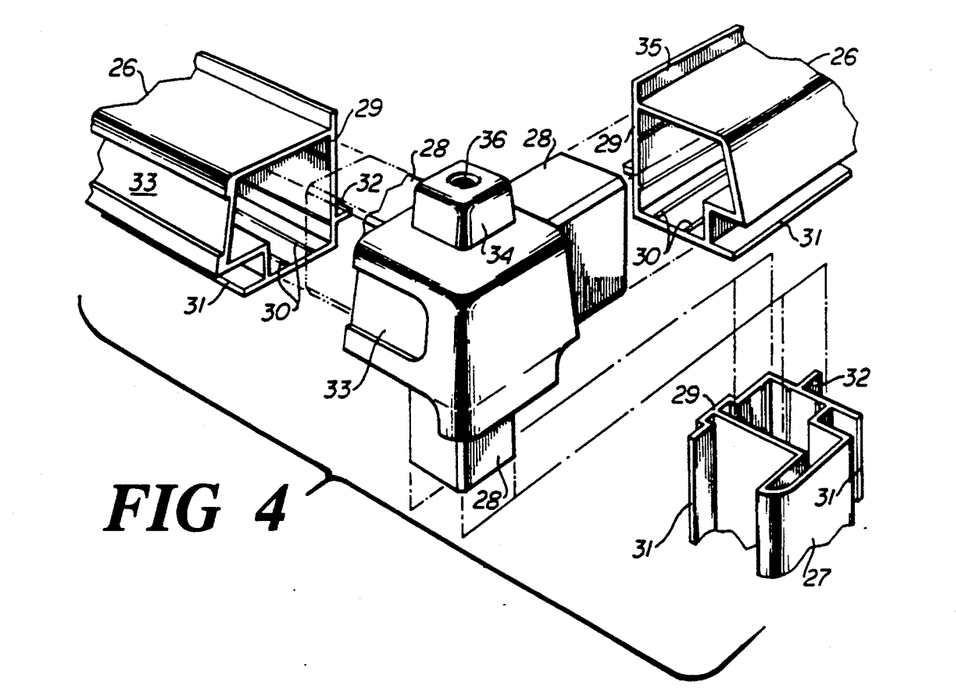
FIG. 4 is an exploded view of the corner assembly.

Referring now to FIGS. 3 and 4, the frame 11 of the cabinet 10 is constructed from a plurality of corner members 25, horizontal frame members 26 and vertical frame members 27. Extending from each corner member 25 are brackets 28. Each horizontal frame member 26 and vertical frame member 27 is slidably positioned over a bracket 28 and abuts the corner member 25. The horizontal frame members 26 and vertical frame members 27 may be welded or otherwise bonded to each other along their interior edges to inhibit the passage of RF waves, moisture and debris. A plurality of nipples 30 are defined on one or more interior surfaces of each of the horizontal frame members 26 and vertical frame members 27. The nipples 30 may be forcibly impressed into the brackets 28 to align the horizontal frame members 26 and the vertical frame member 27 with the corner member 25. Each horizontal frame member 26 and vertical frame member 27 also has a rim or flange 31 defined thereon, onto which a gasket may be mounted. Ridges 32 are defined in each horizontal frame member 26 and vertical frame member 27 onto which supports 23 are mounted. A recess 33 is defined on the front surface of one side of the corner member 25 and one of the horizontal frame members 26 for placement of an emblem or sign.

With further reference to FIGS. 3 and 4, a projection 34 extends upwardly from the corner member 25. The top panel 14 is the same height as the projection 34 and is positioned flush with and abutting the projection 34 with the projection being received within a cutout 17 in the top panel 14. Extending upwardly from the inner edge of each horizontal frame member 26 is a flange 35. When the top is installed, each flange 35 is interior to the lips 16 of the top panel 14. The lips 16 of the top panel 14 are preferably inclined outwardly from parallel so as to provide a natural drain path from the top of the cabinet. This lip and flange arrangement provides a barrier to the passage of RF waves, moisture and debris and promotes the drainage of moisture from the top of the cabinet. As will be explained further, a gasket may be mounted on each flange 35 to provide enhanced EMI/RFI, moisture and debris protection.

As is further shown in FIG. 3, the upper end of each projection 34 has a threaded bore 36 formed therein. An eyelet, hook, or other device useful in transporting the cabinet may be threaded into the bore 36. Alternatively, wheels or casters may also be threaded into the bore of the bottom corner members to enable the cabinet 10 to be rolled from place to place.

Figure 5:
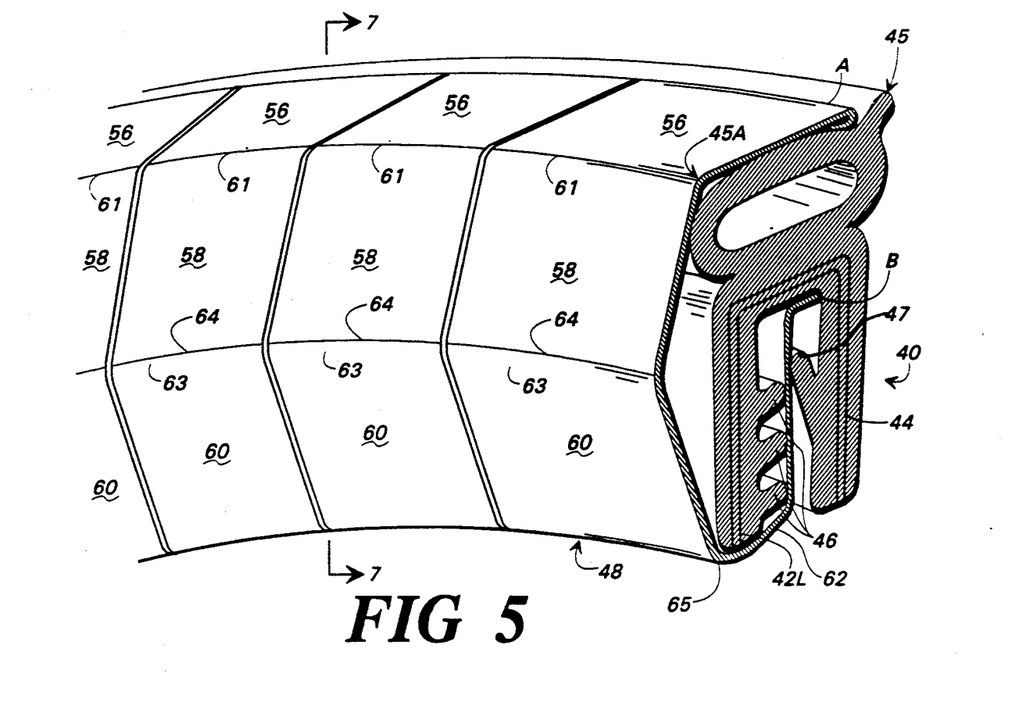
FIG. 5 is a perspective view of an EMI/RFI shielding gasket.

FIG. 5 shows a shielding device 39 including a gasket 40 having a tubular head 41. An interconnected pair of legs 42L and 42R having mutually facing surfaces 43 extend downwardly from the lower portion of the head 41. A U-shaped reinforcing lug 44 is embedded within the legs 42L and 42R and maintains the legs in a mutually opposed relationship. The lug 44 is flexible, preferably being made from steel wire, to allow the gasket 40 to conform to curved surfaces and corners. A pair of ears 45 and 45A angle upwardly from the upper portion of the head 41. On the mutually facing surfaces 43 of the legs 42L and 42R, a plurality of barbs 46 on the leg member 42L and a barb 47 on the leg member 42R angle upwardly and are spaced to frictionally engage flanges 31 or 35 to allow secure positioning of the shielding device 39 on a flange. The tubular head 41, legs 42L and 42R, ears 45 and 45A, and barbs 46 and 47 are preferably made of rubber and coextruded with the lug 44. The shielding device 39 of the disclosed embodiment is manufactured from a commercially available gasket produced by Emka, model no. 1011-05. To produce the shielding device 39, a conductor 48, discussed below, is positioned adjacent to the gasket 40 between points A and B, so that the conductor 48 covers the periphery of the gasket 40 from the ear 45, across the ear 45A, across the tubular head 41, down the outer surface of the leg 42L, and up an inner surface 43 to the tip of the barb 47.

It will be understood that the ear 45A which is covered by the conductor 48 may be removed if desired.

Figure 7:
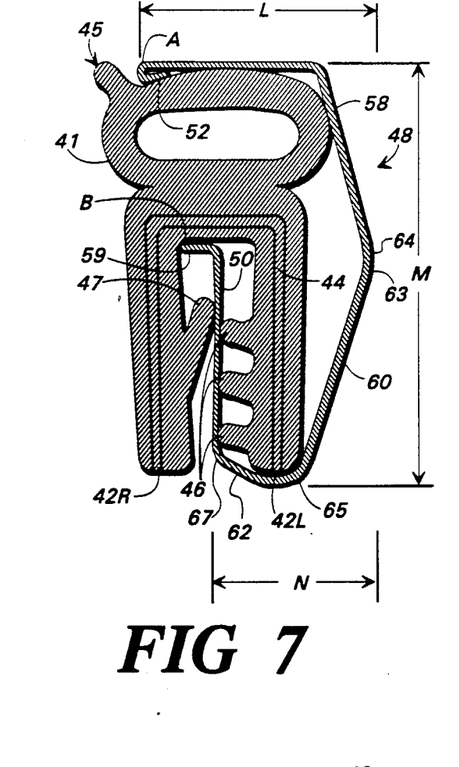
FIG. 7 is a cross-sectional view of the EMI/RFI shielding gasket of FIG. 5 taken along line 7—7.
Figure 8:
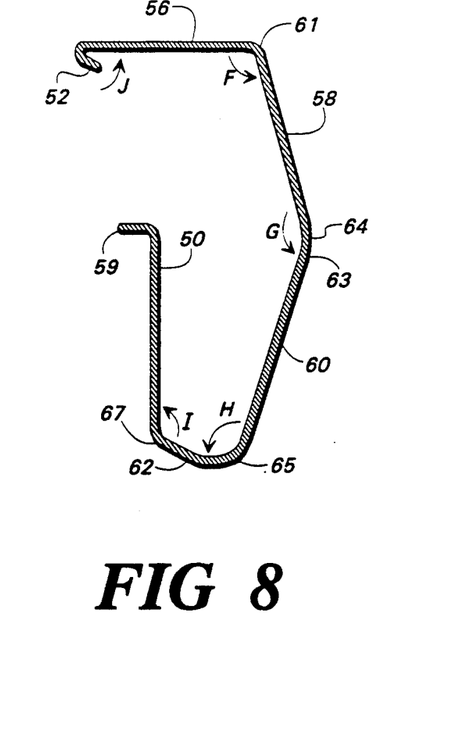
FIG. 8 is an end view of the conductor showing the bends which are made to form the conductor.
Figure 9:
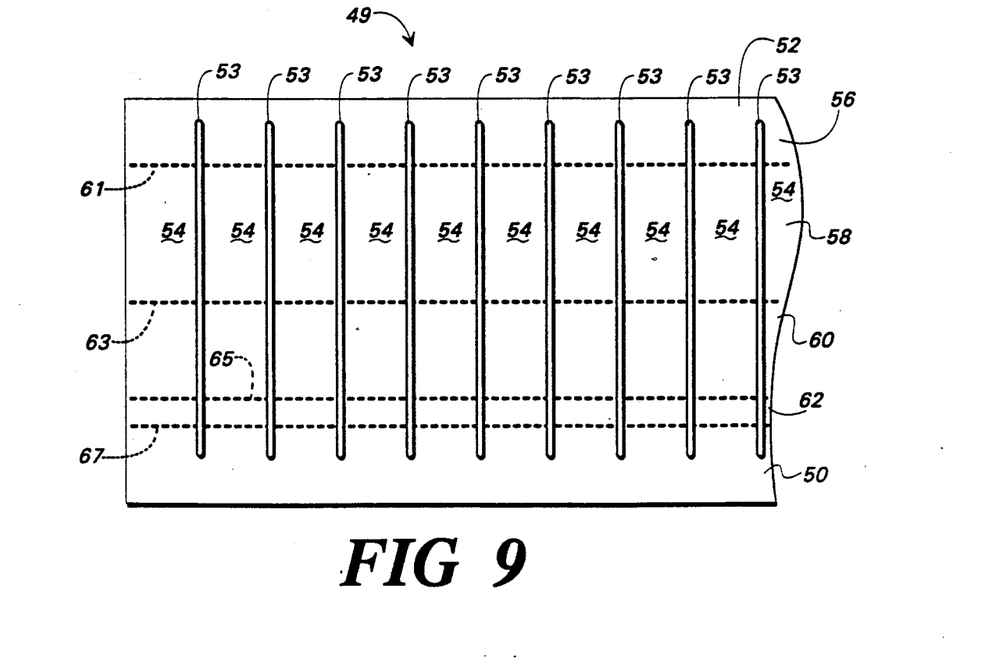
FIG. 9 is a front plan view of a preferred embodiment of a metal blank from which is formed a conductor utilized in the EMI/RFI shielding gasket of FIG. 5.

Turning to FIGS. 5, 7, 8, and 9, there is shown a preferred construction of the conductor 48. The conductor is preferably formed from about a 0.004 inch thick hard temper beryllium copper blank 49, shown in FIG. 9, having a bright tin plating of a thickness of between about 0.0001 and 0.0003 inch. A plurality of gaps 53 are formed on the blank 49 to delineate a plurality of individually movable fingers 54. This material is commercially available in coils and may be configured to the specifications detailed below using conventional metal working equipment. Referring to FIGS. 7 and 8, the conductor 48 is preferably configured to have an elongate strip 50 which extends between the legs 42L and 42R, and an elongate strip 52 in the shape of an inwardly curled lip extending along the outer surface of the head 41 adjacent the ear 45. The plurality of individually movable fingers 54 extend between the strips 50 and 52 to provide a unitary structure. As will be described more fully below, the conductor 48 may be formed by bending the blank 49 along bend lines 61, 63, 65, and 67. In addition to providing a common link between the fingers, the strip 52 also provides a smooth interface between the conductor 48 and the head 41 so that the conductor 48 does not cut into the gasket 39. An L-shaped extension 59 is provided on the strip 50 to provide additional rigidity to the strip 50 and to provide an additional conductive surface area for contact with the flange 31 or 35. The gaps 53 are provided between each of the fingers 54 to provide sufficient clearance for movement. Each gap is preferably of a dimension to block selected wavelengths of electromagnetic radiation such as radio frequency waves.

Experience has shown that effective blocking of a wide range of wavelengths may be accomplished using gaps of about 0.04 inch between each finger, with each finger having a width of approximately 0.56 inch. This provides a gasket capable of shielding equipment producing a wavelength of 1.75 angstroms, which is common in the electronics field. These dimensions have proved successful when used on a shielding device having the following configuration. The fingers are preferably shaped utilizing gradual corners at the bend lines 61, 63, 65, and 67, such that each finger is divided into four sections 56, 58, 60 and 62. As shown in FIG. 8, the sections are configured such that the angle F between sections 56 and 58 is about 105°; the angle G between sections 58 and 60 is about 140°; the angle H between sections 60 and 62 is about 90°; and the angle I between section 62 and the strip 50 is about 110°. It is also preferred that the lip 52 is about 0.178 inch in length, with an angle J between the lip 52 and section 56 of about 16°. The bend line 63 between sections 58 and 60 defines a flex-point 64 on each finger. These flex points provide the fingers with a spring-like action for improved resiliency. For example, when the head 41 is compressed toward the legs 42L and 42R when a door is closed upon the shielding device, sections 58 and 60 move together so as to decrease the angle G between them. As the angle G between sections 58 and 60 decreases, the flex-point 64 on each finger moves outwardly away from the outer surface of the leg 42L. In the preferred embodiment, the distance L between the strip 52 and the flex point 64 is about 0.43 inch, the distance M between bend lines 61 and 65 is about 0.76 inch, and the distance N between flex point 64 and bend line 67 is about 0.29 inch. While it may be understood that the sealing device may be of any size, the relative sizes are preferably made in accordance with the above example. By utilizing a conductor 48 having a unitary structure with individually movable fingers, the sealing device provides a segmented conductive contacting surface having uniform resiliency and capable of withstanding repeated openings and closings of the cabinet 10 without losing alignment of the fingers 54. The alignment is maintained because the novel configuration of the conductor prevents the fingers from becoming permanently bent at various angles. Additionally, the bright, tin plating allows the uniform contact surfaces provided on the conductor to reflect light in a uniform and aesthetically pleasing manner.

Figure 6:
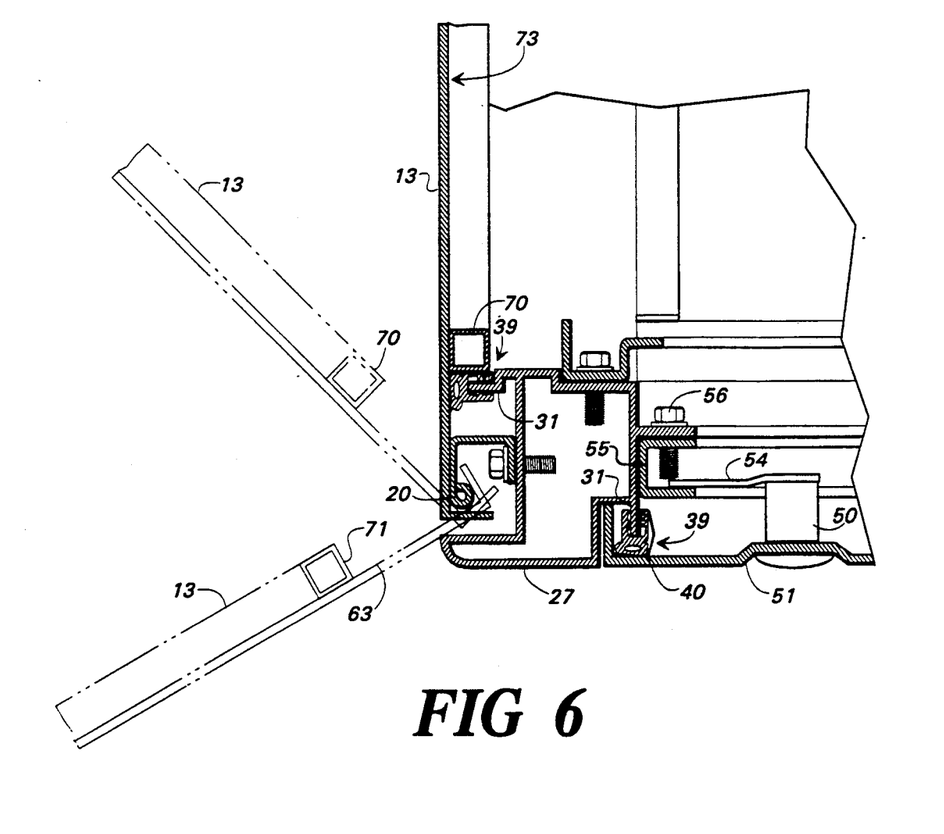
FIG. 6 is a partial horizontal cross sectional view taken along line 6—6 of FIG. 1, showing an EMI/RFI shielding gasket installed in a cabinet and the relation between the gasket and a door and a side panel of the cabinet.

By mounting the shielding device 39 on flanges 35 or 31, the shielding properties of the cabinet 10 may be enhanced to provide increased protection from RF waves, moisture and debris. As best shown in FIG. 6, the gasket 40 is mounted to a flange 35 or 31 by means of the legs 42L and 42R. The legs 42L and 42R are placed over the flange and the barbs 46 and 47 frictionally engage the flange. The lug 44 may be manually compressed inwardly toward the flange to increase the pressure exerted by legs 42L and 42R and barbs 46 and 47 on the flange 35 or 31. This mounting technique allows the shielding device to be securely but quickly and evenly installed or removed without necessitating the use of fasteners, adhesives or other securing devices and allows positioning of the sealing device to provide effective shielding, as explained below.

As can be seen in FIGS. 5 and 7, the conductor 48 extends between the legs 42L and 42R. Therefore, when the gasket 40 is mounted on a flange 35 or 31, section 50 and extension 59 of the conductor are in direct contact with the flange. Also, when the door panel 13 is closed and the side panels 12 are mounted, portions of the interior surfaces of the panels are in direct contact with sections 56, 58, and 60 of the conductor 48. This provides a barrier to the passage of RF waves. At the same time, the ear 45 is also in direct contact with the interior surfaces of the panels 12–15. Moisture and debris are restrained from passing through each joint by the tubular head 41 and ear 45. Moisture and debris allowed to invade the cabinet could damage electrical equipment. Furthermore, the ear 45 protects the conductor 48 from exposure to moisture and debris, thus protecting against degradation of the electrical connection between the doors or side panels and the frame members. Moisture and debris collected on the conductor would degrade the conductor.

Referring again to FIG. 6, a shielding device 39 is shown mounted on a cabinet 10. Each side panel 12 has a hole defined therein through which a bolt 50 is inserted. A recess 51 is preferably provided on each panel 12 to allow a counter-sunk appearance. To install the bolt 50, a latch arm 54 is attached to the inserted bolt 50. A mounting plate 55 is mounted to each vertical frame member 27 by a screw 56, with a portion thereof extending outwardly parallel to the side panel 12. To mount the side panel 12 for contacting one or more of the shielding devices 39 mounted on one of the flanges 31, the bolt 50 is rotated to position the latch arm 54 against the inner facing surface of the mounting plate 55. A slot or other configuration may be provided on each bolt 50 to facilitate rotation. The door panel 13 is mounted using the hinge 20 screwed or bolted to the frame member 27 and positioned in a manner described below. The door panel 13 is shown in solid lines in its closed position in contact with one of the shielding devices 39 mounted on one of the flanges 31 and in phantom lines in various stages of opening and closing.

Referring further to FIG. 6, a pair of sealing devices 39 are shown mounted on flanges 31 of the cabinet 10 to provide EMI/RFI shielding. Because the door panel 13 is generally opened and closed many more times that the other panels, it is critical that the door panel and the sealing device cooperate to provide protection which withstands repeated openings and closings of the door panel. As is shown, the door panel 13 includes a reinforcing member or extrusion 70 which extends vertically along the interior surface of the door panel and is spaced inwardly from the hinge 20. This arrangement results in contact between an inner edge 71 of the extrusion 70 and flexpoints 64 and sections 58 and 60 of the conductor 48 when the door panel is closed. Also, when the door panel is closed, an interior surface 73 of the door panel contacts sections 56 of the conductor and the ear 45 of the gasket 40. To enable these contacts, the hinge is preferably located near an edge of the door panel so that the mounted sealing device is positioned between the hinge and the extrusion 70 when the door panel is closed.

As the door panel 13 is pivoted about the hinge 20 from the open position to the closed position, contact occurs in the following sequence. Initial contact occurs between the inner surface 73 of the door panel and the ear 45 and a portion of each section 56 nearest to the ear 45. As the door panel continues toward the closed position, an increasingly greater portion of each section 56 is contacted by the inner surface 73. This contact gradually compresses the head 41 toward the legs 42L and 42R, moving each flexpoint 64 outwardly away from the outer surface of leg 42L. This compression also tends to force the extension 59 and section 50 of the conductor against the flange on which the sealing device is mounted. As the head 41 continues to compress, the edge 71 of the extrusion 70 contacts each section 58 and 60 of the conductor and each flexpoint 64 as the door reaches its fully closed position. Opening of the door panel reverses the above sequence.

Figure 10:
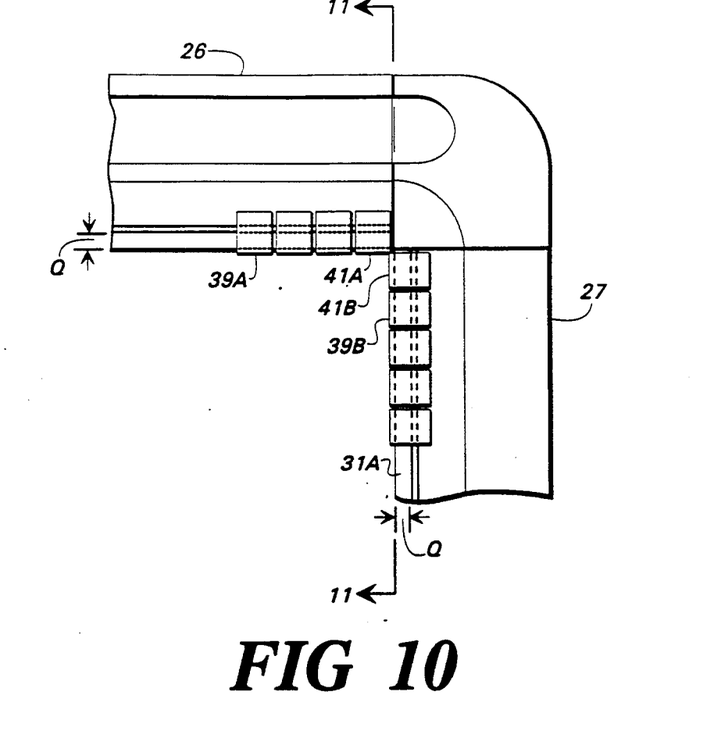
FIG. 10 is a fragmentary close-up view of the EMI/RFI gasket of FIG. 5 installed on the cabinet of FIG. 1.
Figure 11:
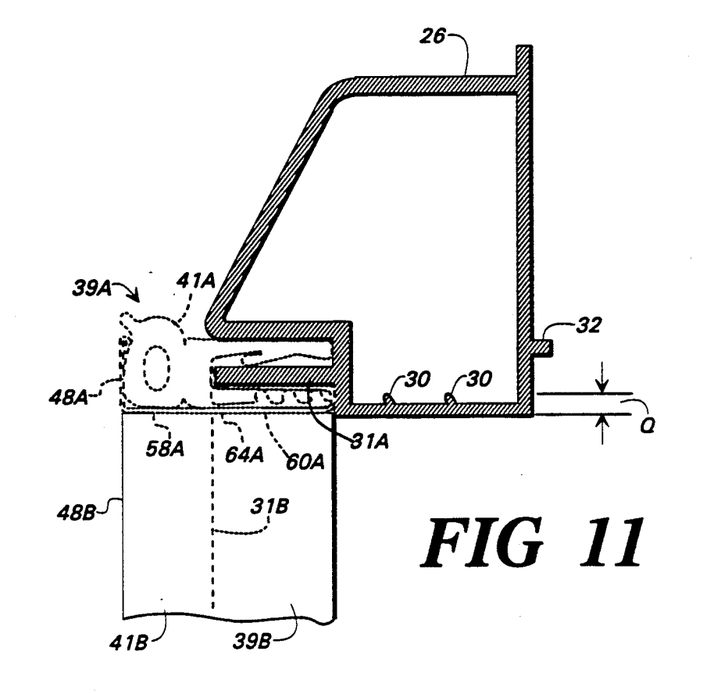
FIG. 11 is a cross-sectional view taken along line 11—11 of FIG. 10, showing the relation between a pair of EMI/RFI shielding gaskets installed in a cabinet.

While it will be understood that a single length of sealing device may be intalled for each panel opening of the cabinet, it is preferred that several lengths be utilized as set forth below. Referring now to FIGS. 3, 10, and 11, it can be seen that the relative positions of the flanges are important to allow positioning of lengths of the sealing device to eliminate gaps between lengths which would allow electromagnetic waves, moisture, and debris to pass through the panel openings. As is best shown in FIGS. 10 and 11, the flanges are positioned such that portions of the conductors 48A and 48B on each of the tubular heads 41A and 41B of adjacent lengths of sealing devices 39A and 39B are in direct contact with one another to provide a continuous conductive interface. It has been discovered that this may be facilitated by offsetting each flange 31A and 31B from the edge of each horizontal and vertical frame member by a distance Q, which is approximately equal to the width of the leg 42L. In the preferred embodiment, distance Q is about 0.09 inch.

When the sealing devices 39A and 39B are mounted on flanges 31A and 31B, respectively, contact occurs between the shielding devices to provide continuous EMI/RFI shielding and protection from the passage of moisture and debris between the shielding devices. Referring further to FIG. 11, it will be appreciated that the novel positioning of the flanges 31A and 31B allows the sealing device 39A to abut the sealing device 39B adjacent thereto. This places a cross-sectional edge of sections 58A and 60A and flexpoint 64A of the conductor 48A in contact with an edge of the conductor 48B. Each conductor 48A and 48B is positioned on its respective sealing device 39A or 39B in the manner previously explained for sealing device 39 and conductor 48. To fill any space which may exist to channel moisture or debris through the interface between the sealing devices 39A and 39B, a filler material such as silicone may be provided along the outer edge of the interface in a manner which does not interfere with the conductive contact between the sealing devices.

Significant advantages of the present invention arise from the manner in which the conductor 48 extends around the base of the leg 42L and between the inner surfaces 43 of the legs and the corresponding flange 35 or 31. First, by directly contacting the conductor 48 against the corresponding flange and the side panel 12 or door panel 13, a better shielding interface is obtained. Secondly, both the barb 47 and conductor 48 exert clamping forces to impress the conductor against the flange. Other advantages provided by the present invention are better alignment of the gasket on the flanges, straightforward installation without the use of adhesives or fasteners, and improved aesthetics and durability.

The foregoing description relates to a preferred embodiment of the present invention, and modifications or alterations may be made without departing from the spirit and scope of the invention as defined in the following claims.

What is claimed is:

1. A sealing device, comprising:
an elongate compressible, resilient head;
a pair of legs extending downwardly from said head; and
a conductor disposed between said legs and extending upwardly adjacent the outer surface of one of said legs and a portion of said head, said conductor comprising:
a plurality of individually movable fingers each extending from between said legs to the outer surface of said head; and
means for interconnecting said fingers.

2. The device of claim 1, wherein said interconnecting means comprises an elongate strip of conductive material extending between said legs and attached to each of said fingers.

3. The device of claim 1, wherein said interconnecting means comprises a first elongate strip extending between said legs and attached to each of said fingers, and a second elongate strip of conductive material extending along the outer surface of said head and attached to each of said fingers.

4. The device of claim 3, wherein said second strip is positioned adjacent to said head and having an inwardly curled lip thereon for contacting said head.

5. The device of claim 4, wherein said legs include a plurality of projections positioned to abut said first strip.

6. The device of claim 5, wherein said second strip defines an extension positioned to extend from said second strip at an angle.

7. The device of claim 1, wherein said fingers are shaped to bow outwardly from the outer surface of said one of said legs.

8. The device of claim 7, wherein a gap is provided between said fingers, said gap being of a dimension to block selected wavelengths of electromagnetic radiation.

9. The device of claim 8, wherein said gap is of a dimension to block radio frequency wavelengths.

10. The device of claim 9, wherein said gap is about 0.04 inch.

11. The device of claim 10, wherein each of said fingers has a width of about 0.56 inch.

12. The device of claim 1, wherein said head is a tubular head having at least one ear formed thereon.

13. The device of claim 1, wherein said conductor is made from beryllium copper having a tin plating.

14. A sealing device, comprising:
an elongate compressible, resilient head having an ear formed thereon;
a pair of legs extending downwardly from said head and having mutually facing inner surfaces; and
a conductor disposed between said mutually facing surfaces and extending upwardly adjacent the outer surface of one of said legs and a portion of said head, said conductor comprising:
a first strip of conductive material spaced apart from a second strip of conductive material,
said first strip being positioned adjacent said head and said ear and defining an inwardly curled lip thereon for contacting said head,
said second strip being positioned between said mutually facing surfaces and extending generally parallel to said facing surfaces and defining a second lip positioned intermediate said facing surfaces; and
a plurality of spaced apart fingers, each extending from said first strip to said second strip and being shaped to bow outwardly from the outer surface of said one of said legs.

15. The device of claim 14, wherein said conductor extending adjacent a portion of said head comprises said conductor extending from a point abutting said ear in only one direction.

16. The device of claim 15, further comprising a second ear formed thereon and positioned underneath said conductor.

17. The device of claim 14, further comprising at least one barb projecting from at least one of said inner surfaces.

18. The device of claim 14, further comprising a lug embedded within said legs.

19. The device of claim 14, wherein said fingers are shaped to bow outwardly from the outer surface of said one of said legs.

20. The device of claim 19, wherein said fingers are shaped by forming smooth curves along sections of said fingers.

21. An EMI/RFI shielded cabinet, comprising:
a corner member having a plurality of brackets extending therefrom and positioned normal to one another;
a plurality of frame members corresponding to said plurality of brackets, one of said frame members being slidably positioned over each of said brackets and abutting said corner member;
a flange extending upwardly from each of said plurality of frame members;
a top panel having a downwardly extending lip formed around its periphery, said top panel being positioned atop said plurality of frame members such that said lip on said top panel is disposed exteriorly of said flange on said plurality of frame members such that said flange extends upwardly toward said top panel at a point inside the outer periphery; and a gasket attached to said flange on each of said plurality of frame members, a portion of said gasket extending between said top panel and said flange to effect a seal between said top panel and said flange, said gasket comprising:

an elongate compressible, resilient head;

a pair of legs extending downwardly from said head; and a conductor disposed between said legs and extending upwardly adjacent the outer surface of one of said legs and a portion of said head, said conductor comprising:

a plurality of individually movable fingers each extending from between said legs to the outer surface of said head; and means for interconnecting said fingers.

22. An EMI/RFI shielded cabinet, comprising:

at least one frame member defining an elongate flange;

at least one panel capable of being positioned adjacent to said flange, said flange and said panel defining an elongate joint therebetween; and a shielding device mounted on said flange for shielding said joint, said shielding device comprising:

an elongate compressible, resilient head;

a pair of legs extending downwardly from said head; and a conductor disposed between said legs and extending upwardly adjacent the outer surface of one of said legs and a portion of said head, said conductor comprising:

a plurality of individually movable fingers each extending from between said legs to the outer surface of said head; and means for interconnecting said fingers.

23. The cabinet of claim 22, wherein said conductor contacts said panel at at least two points on said panel.

24. The cabinet of claim 23 further comprising at least two of said shielding devices positioned substantially perpendicular to one another defining a joint between said shielding devices, said joint having a filler material positioned therein for sealing said joint.

25. The cabinet of claim 22, wherein said cabinet comprises:

a first frame member defining a first elongate flange;

a second frame member defining a second elongate flange, said second flange being positioned perpendicular to said first flange and having an end extending within a short space of an end of said first flange at a corner of said cabinet; and a pair of said shielding devices, including:

a first shielding device positioned on said first flange and extending to said end of said first flange;

a second shielding device positioned on said second flange and extending to abut a side of said first shielding device.

* * * * *